(12) United States Patent
Draving

(10) Patent No.: US 11,255,893 B2
(45) Date of Patent: Feb. 22, 2022

(54) MEASURING ERROR IN SIGNAL UNDER TEST (SUT) USING MULTIPLE CHANNEL MEASUREMENT DEVICE

(71) Applicant: Keysight Technologies, Inc., Santa Rosa, CA (US)

(72) Inventor: Steven D. Draving, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 553 days.

(21) Appl. No.: 16/109,440

(22) Filed: Aug. 22, 2018

(65) Prior Publication Data

US 2020/0064386 A1 Feb. 27, 2020

(51) Int. Cl.
*G01R 29/26* (2006.01)
*G01R 13/02* (2006.01)
*G01R 31/317* (2006.01)

(52) U.S. Cl.
CPC ......... *G01R 29/26* (2013.01); *G01R 13/0218* (2013.01); *G01R 31/31709* (2013.01)

(58) Field of Classification Search
CPC ............ G01R 13/0218; G01R 13/0272; G01R 19/02; G01R 19/2509; G01R 19/26
See application file for complete search history.

(56) References Cited

U.S. PATENT DOCUMENTS

| | | | | |
|---|---|---|---|---|
| 5,400,265 A | * | 3/1995 | Kauppinen | G01J 3/453 250/339.08 |
| 6,594,595 B2 | | 7/2003 | Yamaguchi et al. | |
| 7,317,999 B2 | | 1/2008 | Ninomiya et al. | |
| 8,155,913 B2 | | 4/2012 | Eliyahu et al. | |
| 2002/0176525 A1 | * | 11/2002 | Yamaguchi | H04L 1/205 375/371 |
| 2005/0238094 A1 | * | 10/2005 | Bessho | G01R 29/26 375/226 |
| 2005/0273320 A1 | * | 12/2005 | Yamaguchi | G01R 23/16 704/205 |
| 2009/0154607 A1 | * | 6/2009 | Lindoff | H04L 1/0091 375/341 |

OTHER PUBLICATIONS

Jason Breitbarth, "Cross Correlation in Phase Noise Analysis," Microwave Journal, Feb. 2011, 1-5 pgs.

* cited by examiner

*Primary Examiner* — Michael J Dalbo

(57) ABSTRACT

A method measures a characteristic of a SUT using a signal measurement device having multiple input channels. The method includes digitizing first and second copies of the SUT in first and second input channels to obtain first and second digitized waveforms; repeatedly determining measurement values of the SUT characteristic in the first and second digitized waveforms to obtain first and second measurement values, respectively, each second measurement value being paired with a first measurement value to obtain measurement value pairs; multiplying the first and second measurement values in each of the measurement value pairs to obtain measurement products; determining a mean-squared value (MSV) of the SUT characteristic measurement; and determining a square root of the MSV to obtain a root-mean-squared (RMS) value of the measured SUT characteristic, which substantially omits variations not in the SUT, which are introduced by only one of the first or second input channel.

20 Claims, 5 Drawing Sheets

US 11,255,893 B2

MEASURING ERROR IN SIGNAL UNDER TEST (SUT) USING MULTIPLE CHANNEL MEASUREMENT DEVICE

BACKGROUND

An oscilloscope may be used to measure various characteristics of a signal under test (SUT), such as a radio frequency (RF) signal generated by a device under test (DUT) or otherwise output DUT in response to a stimulus signal. Examples of measurable SUT characteristics include frequency, period, pulse width, rise time, voltage noise, phase noise, time jitter, and slew rate. However, sensitivity of the measurements may be limited by measurement errors (noise) introduced by input channels of the oscilloscope used to receive the SUT. The measurement errors generally result from various types of vertical and horizontal (timing) errors, including random voltage noise, additive periodic voltage error, random time jitter, and additive periodic time jitter, for example. When measuring SUT characteristics received through multiple oscilloscope channels, some of the measurement errors introduced by each channel include errors that are un-correlated to the SUT and uncorrelated to the other channel. These uncorrelated measurement errors remain in the SUT, and therefore affect accuracy of measurement and/or display of the SUT characteristics.

Accordingly, oscilloscopes are not usually used for making various types of measurements of various SUT characteristics, such as phase noise. Generally, variations in the SUT cannot be distinguished from variations caused by measurement errors introduced by the oscilloscope channels when measuring the SUT characteristics. Rather, spectrum analyzers are more likely used to measure phase noise, for example, although some spectrum analyzers can only discriminate phase noise from amplitude noise over a limited frequency offset range. Also, many spectrum analyzers simply measure total single-sideband noise adjacent to the RF carrier. Other systems used to measure phase noise of an RF signal include dedicated phase noise measurement systems, such as E5500 Series Phase Noise Measurement Solutions available from Keysight Technologies, Inc., and signal source analyzers, such as E5052B Signal Source Analyzer available from Keysight Technologies, Inc. These measurement systems use heterodyning to demodulate phase in the frequency domain, have low measurement error floor, and are relatively fast. However, such measurement systems cannot measure data-type signals or spread-spectrum clocking-type signals, and are generally limited to a maximum offset frequency of 100 MHz.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

Figure 1A:
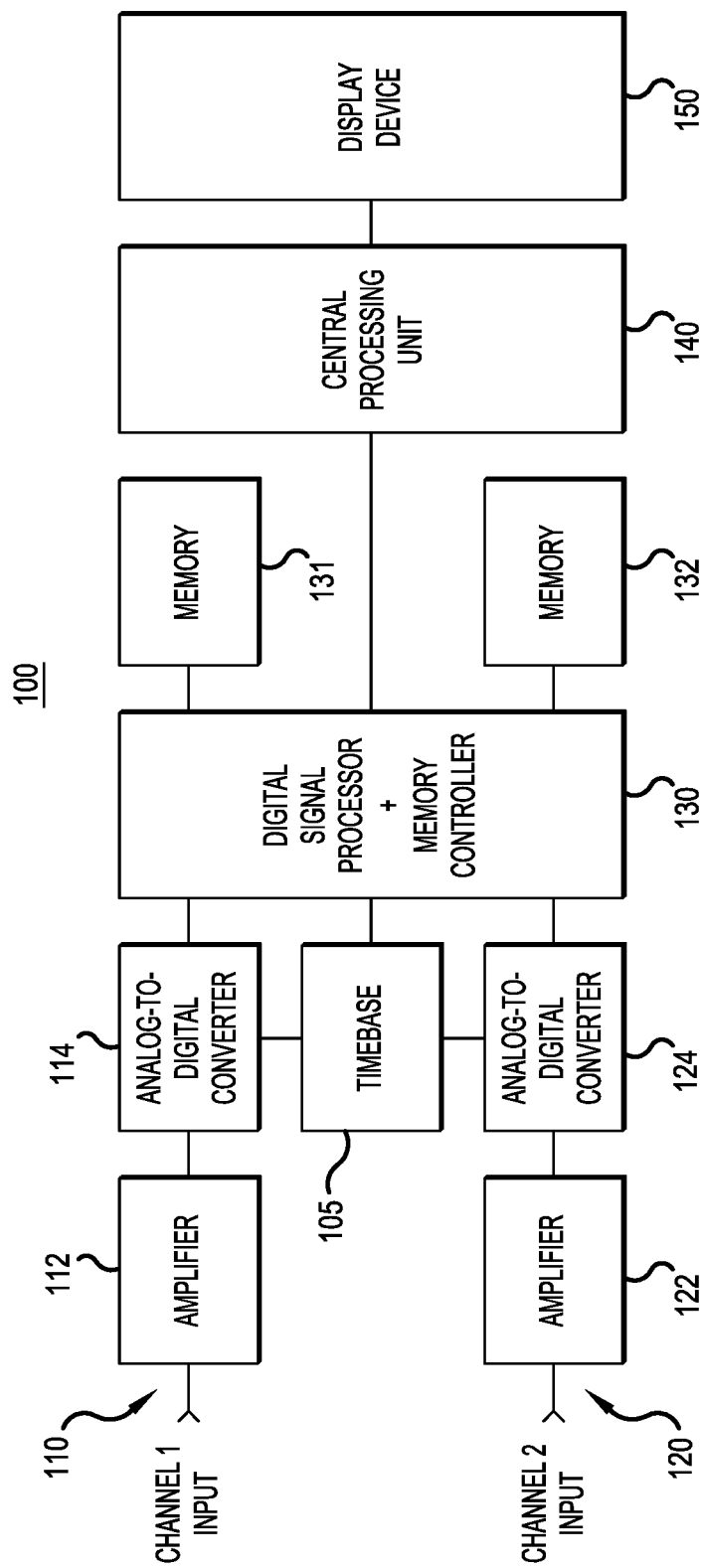
FIG. 1A is a simplified block diagram of a system for testing a signal under test (SUT) using a signal measurement device having multiple input channels, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Various representative embodiments of the disclosure generally provide a system and a method to measure one or more characteristics of a signal under test (SUT) output by a device under test (DUT) using a measurement system, such as an oscilloscope including a digital signal processor (DSP), having multiple channels for receiving copies of the SUT. The embodiments provide low noise and distortion measurements, for example, on data and spread-spectrum clocking (SSC) signals performed using multiple channels of oscilloscope(s). Also, the maximum offset frequency range is extended beyond 100 MHz, up to about one half of the carrier frequency for phase noise measurements. As additional examples, the embodiments may measure signals that have been arbitrarily digitally filtered, may compute integrated phase jitter after applying arbitrary digital filtering, and may remove SSC phase modulation from a measured clock prior to integrating phase jitter.

According to a representative embodiment, a method is provided for measuring a characteristic of a SUT output by a DUT using a signal measurement device having multiple input channels. The method includes receiving the SUT, digitizing a first copy of the SUT in a first input channel to obtain one or more first digitized waveforms, digitizing a second copy of the SUT in a second input channel to obtain one or more second digitized waveforms, repeatedly determining measurement values of the SUT characteristic in the first digitized waveforms to obtain multiple first measurement values, repeatedly determining second measurement values of the SUT characteristic in the second digitized waveforms to obtain multiple second measurement values, where each second measurement value being is paired with a first measurement value, respectively, to obtain measurement value pairs. The method further includes multiplying the first measurement value and the second measurement value in each of the measurement value pairs to obtain measurement products, determining an average value of the measurement products to obtain a mean-squared value (MSV) of the measured SUT characteristic, and determining a square root of the MSV to obtain a root-mean-squared (RMS) value of the measured SUT characteristic. The RMS value of the measured SUT characteristic includes variations in the SUT that are in both the first and second input channels, and substantially omits variations not in the SUT, which are introduced by only one of the first input channel or the second input channel as a result of respective measurement errors.

According to another representative embodiment, a method is provided for measuring a characteristic of a SUT output by a DUT using a signal measurement device having a multiple input channels. The method includes receiving the SUT, digitizing a first copy of the SUT in a first input channel to obtain one or more first digitized waveforms, digitizing a second copy of the SUT in a second input channel to obtain one or more second digitized waveforms, repeatedly determining a first measurement trend to obtain multiple first measurement trends, each first measurement trend corresponding to multiple measurements of the SUT characteristic in the one or more first digitized waveforms, respectively, and repeatedly determining a second measurement trend to obtain multiple measurement trends, each second measurement trend corresponding to multiple measurements of the SUT characteristic in the one or more second digitized waveforms, respectively. Each second measurement trend is paired with a first measurement trend, respectively, to obtain multiple measurement trend pairs. The method further includes cross-correlating the first measurement trend and the second measurement trend in each of the measurement trend pairs to obtain cross-correlation vectors, extracting zero-displacement values from the cross-correlation vectors, respectively, where extracting the zero-displacement values includes identifying a value from each cross-correlation vector that was obtained using zero skew between the first measurement trend and the second measurement trend in the measurement trend pair, and discarding all other values from other cross-correlation vectors. The method further includes summing the zero-displacement values of the cross-correlation vectors to obtain a sum of measurement products for the measurement trend pairs, dividing the sum of zero-displacement values by a total number of measurement products of the plurality of cross-correlation vectors to obtain an average value of the measurement products, which corresponds to a MSV of the measured SUT characteristic, and determining a square root of the average value of the MSV to obtain a RMS value of the measured SUT characteristic. The RMS value includes variations in the SUT, which is in both the first and second channels, and substantially omits un-correlated variations not in the SUT, which is introduced by only one of the first channel or the second channel.

According to another representative embodiment, a method is provided for measuring a characteristic of a SUT output by a DUT using a signal measurement device having multiple input channels. The method includes receiving the SUT, digitizing a first copy of the SUT in a first input channel to obtain one or more first digitized waveforms, digitizing a second copy of the SUT in a second input channel to obtain one or more second digitized waveforms; repeatedly determining a first measurement trend to obtain multiple first measurement trends, each first measurement trend corresponding to multiple measurements of the SUT characteristic in each first digitized waveform, respectively, and repeatedly determining a second measurement trend to obtain multiple second measurement trends, each second measurement trend corresponding to multiple measurements of the SUT characteristic in each second digitized waveform, respectively. Each second measurement trend is paired with a first measurement trend, respectively, to obtain multiple measurement trend pairs. The method further includes performing a discrete Fourier transform (DFT) on the first measurement trend and the second measurement trend in each of the measurement trend pairs to obtain corresponding first and second measurement amplitude spectrums for each of the measurement trend pairs, cross-correlating the first measurement amplitude spectrum and the second measurement amplitude spectrum in each of the measurement trend pairs to obtain measurement power spectrums, and averaging the measurement power spectrums to obtain an average measurement power spectrum of the SUT, which is in both the first and second channels, and substantially omitting measurement errors not in the SUT, which are introduced by only one of the first channel or the second channel.

In the conventional methods, any measurement error (e.g., noise and/or jitter) attributable to the oscilloscope's digitizing process in the two digitizing channels adds directly to the measurement result, and cannot be distinguished from variations in the SUT. However, using cross-correlation according to the various embodiments, only the SUT characteristics and associated variations in the SUT that are correlated across both digitizing channels (including SUT characteristics corresponding to the various types of measurement errors and/or the variations themselves) remain in the measurement result, since they are attributable to the actual SUT (appearing in both copies). Over multiple iterations, the measurement errors that are uncorrelated across the two digitizing channels average to zero, leaving only characteristics attributable to the SUT.

Examples of a SUT characteristic to be measured using an oscilloscope are time-interval error (TIE) jitter, which is a measure of edge time error, and phase noise. Conventional TIE jitter measurements can be performed in a variety of ways, but are commonly performed in oscilloscopes by locating times corresponding to all threshold crossings of edges of a digitized SUT waveform that has been received by the oscilloscope, then determining the difference between those measured edge times and the ideal (error-free) times of those edges. The ideal edge times may be determined, for example, using a best-fit linear model of the edge times, in order to represent a constant frequency clock. Alternatively, the ideal edge times may be determined using a phase-locked loop emulation algorithm, for example. The ideal edge times may even be received by the oscilloscope on another independent input channel. The TIE jitter measurement produces a set of edge time error values, collected from a single digitized SUT waveform or from multiple SUT waveforms. The standard deviation of the edge time error values due to variations in the SUT may be determined and reported in seconds root mean squared (RMS).

In comparison, the disclosed embodiments related to measuring TIE jitter (as well as measuring phase noise) operate on two copies of the SUT. The copies of the SUT are digitized, without demodulation using heterodyning techniques, by two independent oscilloscope input channels, respectively. Once digitized, TIE measurement values of the SUT copies are determined in pairs, with one TIE measurement value of each pair computed from each SUT copy. A product of the TIE measurement values in each pair is determined, and the average of the products of the pairs is then calculated. The average provides an estimate of variance or mean-squared value (MSV) of the TIE jitter. Taking the square root of the MSV results in the standard deviation or root-mean-squared (RMS) value of the TIE jitter.

TIE measurement values may be obtained, stored and reported as sequential time vectors, or TIE trends. In this case, the disclosed embodiments operate on pairs of TIE trends, where one TIE trend of each TIE trend pair is determined from each SUT copy. The TIE trends in each pair are cross-correlated with one another to obtain a corresponding cross-correlation vector. Zero-displacement values are extracted from the cross-correlation vectors, respectively, using zero-displacement ($\tau=0$) between the TIE trends in the respective pairs. The extracted zero-displacement values are added to obtain a sum of measurement products for the measurement trend pairs. Dividing the sum of the measurement products by the total number of elements in all the TIE trends in all the pairs is equivalent to computing the variance of the TIE jitter of the SUT, so the standard deviation of the TIE jitter in seconds RMS may be determined by taking the square-root of this variance value. Although the illustrative embodiments improve sensitivity and accuracy of TIE jitter and phase jitter measurements, for example, they apply to various other types of measurement error, without departing from the scope of the present teachings.

The extent of improvement to the SUT from the cross-correlation depends, in part, on the number of edges in a digitized waveform of the SUT included in the calculation. More edges provide better oscilloscope jitter and noise reduction. Increasing the time range of each acquisition and the accumulating edges from multiple acquisitions, increases the number of edges analyzed. When using two channels of an oscilloscope, the embodiments reduce the uncorrelated noise introduced by each channel. The embodiments may also reduce low-frequency jitter, for example, introduced by timebase clocks, whenever independent timebase clocks are used to control the two channels, respectively. That is, the low-frequency jitter contributed by the oscilloscope is normally correlated across the two channels when the channels share the same timebase clock (of the oscilloscope), so the low-frequency jitter introduced by the clock would be correlated and thus would not be reduced by the embodiments. However, if the two inputs of the channels are on two different oscilloscope frames of a multiscope system, with independent timebase clocks, then most of the low frequency jitter would likewise be reduced by the embodiments. More than two channels of one or more oscilloscopes may be used, as well, which increases the number of correlations.

The embodiments may be implemented on SSC signals, for example, as mentioned above, because phase demodulation is performed using edge finding, e.g., by a DSP, instead of heterodyning. The use of edge finding also enables the embodiments to work on data-type signals. Also, the embodiments may be incorporated into existing random jitter (RJ) and/or deterministic jitter (DJ) separation and total jitter (TJ) extrapolation algorithms to improve their measurement accuracy and sensitivity.

In more complex embodiments, digital waveforms are converted to the frequency domain using discrete Fourier transform (DFT) techniques, as discussed below with reference to FIG. 4. The resulting jitter spectrum (JS) may be presented as is, or converted into a phase noise (PN) measurement result. Thus, according to various embodiments, the cross-correlation may be performed in the time-domain, discussed above, or in the frequency-domain. Also, there are computational speed advantages to dividing the full offset frequency range of the JS or PN measurement into smaller segments, and decimating the digitized waveforms by different amounts for each segment. When measuring data-type signals, missing edges need to be interpolated over to produce a uniformly sampled digitized waveform prior to conversion to the frequency domain. Also, data-dependent jitter (DDJ) should be removed from the digitized signals. The computations of the various embodiments may be implemented using DSP hardware and/or firmware in order to increase computational speed.

FIG. 1A is a simplified block diagram of a system for measuring characteristics of a SUT using a signal measurement device having multiple input channels, according to a representative embodiment. Examples of characteristics that may be measured include phase noise, jitter (e.g., time jitter, TIE jitter, random jitter, deterministic jitter, period-to-period jitter, total jitter), frequency, period, pulse width, rise time, voltage noise, and slew rate, although other SUT characteristics may be measured according to various embodiments, without departing from the scope of the present teachings. More particularly, measuring characteristics of the SUT includes substantially removing measurement error introduced by the multiple input channels, respectively, receiving copies of the SUT. The measurement error may result from additive errors, including vertical and horizontal (timing) errors, added to the SUT during transmission through the input channels. Measuring a characteristic of the SUT includes measuring the effects of variations in the SUT on the SUT characteristic, although in some instances (e.g., when measuring types of jitter), the variations in the SUT make up the measured SUT characteristic itself.

Some measurement error introduced by the signal measurement device is correlated across the two input channels (referred to as correlated measurement error) and other measurement error is uncorrelated across the two channels (referred to as uncorrelated measurement error). The correlated measurement error originates from common source, such as a common timebase clock, for example, while the uncorrelated measurement error originates in only one input channel, and not in the other input channel. The SUT variation we desire to include in the measurement is correlated across the two input channels because the single input SUT is measured by both input channels.

Referring to FIG. 1A, test system 100 may be an oscilloscope, for example, having multiple input channels, indicated by representative first input channel 110 and second input channel 120. As mentioned above, more than two input channels may be incorporated, increasing a number of correlations, without departing from the scope of the present teachings. The first input channel 110 includes first amplifier 112 and first analog to digital converter (ADC) 114, and the second input channel 120 includes second amplifier 122 and second ADC 124. The test system 100 receives a SUT output by a DUT (e.g., DUT 160 shown in FIG. 1B), where the SUT may be generated by the DUT or output in response to a stimulus signal received by the DUT.

The first input channel 110 receives and digitizes a first copy of the SUT using the first ADC 114 to obtain one or more first digitized waveforms, and the second input channel 120 receives and digitizes a second copy of the SUT using the second ADC 124 to obtain one or more second digitized waveforms. The first and second ADC 114 and 124 may be synchronized using time base 105. Also, the timing of the copies of the SUT may be associated using the time base 105, in part, so that portions of the copies are properly matched during processing. When the SUT is a single-ended signal, the first and second copies of the SUT may be obtained by splitting the SUT, e.g., using an RF splitter or diplexer (not shown). Alternatively, when the SUT is a differential signal, the first and second copies of the SUT, respectively digitized in the first and second input channels 110 and 120, may correspond to inverted and non-inverted sides of the differential signal. The test system 100 is used to measure at least one characteristic of the SUT, where the measured characteristic includes relevant variations in the SUT.

However, as discussed above, each of the first input channel 110 and the second input channel 120 introduces measurement error in the first copy and the second copy of the SUT, respectively. The measurement error introduced by the first input channel 110 includes at least additive errors (e.g., vertical and horizontal errors) from at least the first amplifier 112 and the first ADC 114 processing the first copy of the SUT, and the measurement error introduced by the second input channel 120 includes at least additive errors from at least the second amplifier 122 and the second ADC 124 processing the second copy of the SUT. The measurement errors cause additional variations that affect the SUT characteristic being measured.

The test system 100 further includes a DSP 130, which has a memory controller for communicating with first memory 131 and second memory 132. The first memory 131 stores data collected from and/or relating to the first copy of the SUT digitized by the first ADC 114, and the second memory 132 stores data collected from and/or relating to the second copy of the SUT digitized by the second ADC 124. The DSP 130 is programmed to perform various steps of the methods of testing a SUT, discussed below with reference to FIGS. 2, 3 and 4, including removing measurement error from the SUT, is introduced by the first and second input channels 110 and 120, by cross-multiplying or performing cross-correlation of the first and second copies of the SUT. Measurement error that is specific to one or the other of the first and second input channels 110 and 120, and thus extraneous to the noise and variations in the SUT itself, is uncorrelated and can thus be separated out.

The DSP 130 is controlled by a central processing unit (CPU) 140, for example. The CPU 140 is programed to format the output of the DSP 130 for display on a display 150, which may by an oscilloscope display, thereby providing a display interface. The CPU 140 may also be programmed to provide a user interface, such as a graphical user interface (GUI), between the test system 100 and a user, e.g., using the display 150. As such, the test system 100 may receive input from the user through any of various types of compatible input devices, such as a keyboard, a mouse, dials and/or a touch screen, for example, and display measurement results in response.

Generally, each of the DSP 130 and the CPU 140 may be implemented by one or more computer processors, field-programmable gate arrays (FPGAs), application specific integrated circuits (ASICs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the CPU 140, for example, executes an operating system. Also one or both of the DSP 130 and the CPU 140 may be implemented using a personal computer (PC), for example.

Each of the first memory 131 and the second memory 132 may receive and store time domain data and/or frequency domain data, as well as processing results (e.g., regarding cross-correlation and other signal processing). The first and second memories 131 and 132 may be implemented by any number, type and combination of random access memory (RAM) and read-only memory (ROM), for example, and may store various types of information, such as computer programs and software algorithms executable by the DSP 130. The ROM and RAM may include any number, type and combination of computer readable storage media, such as a disk drive, disk storage, flash memory, electrically programmable read-only memory (EPROM), electrically erasable and programmable read only memory (EEPROM), a universal serial bus (USB) drive, a CD, a DVD, and the like, which are tangible and non-transitory storage media (e.g., as compared to transitory propagating signals).

Figure 1B:
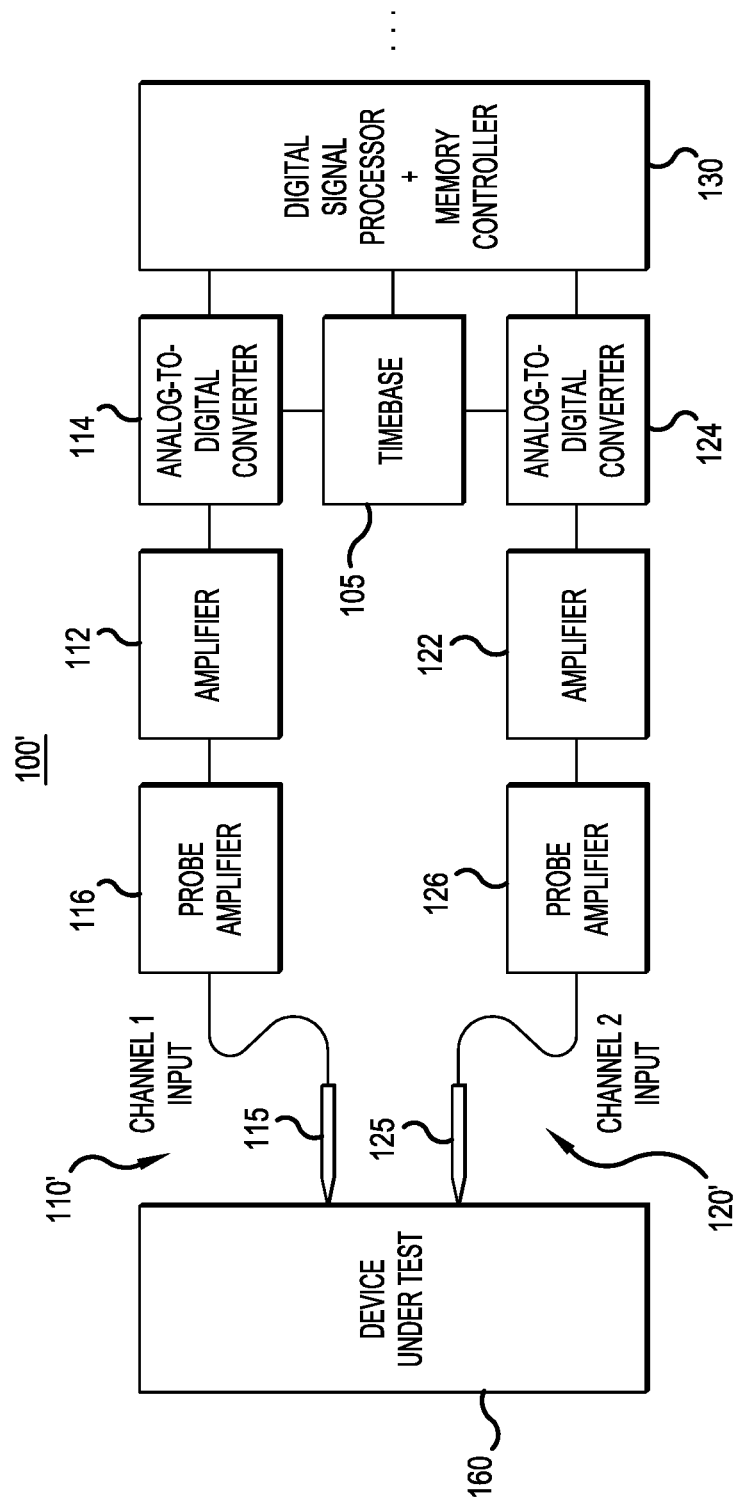
FIG. 1B is a simplified block diagram of a system for testing a SUT using a signal measurement device having multiple input channels including measurement probes, according to a representative embodiment.

FIG. 1B is a simplified block diagram of the system for measuring characteristics of the SUT using a signal measurement device having multiple input channels and corresponding measurement probes, according to a representative embodiment.

Referring to FIG. 1B, test system 100' includes a first channel 110' and a second channel 120', as well as the other features depicted in the test system 100. The first channel 110' includes a first probe 115 and a first probe amplifier 116, as well as the first amplifier 112 and the first ADC 114, where the first copy of the SUT is received via the first probe 115. Likewise, the second channel 120' includes a second probe 125 and a second probe amplifier 126, as well as the second amplifier 122 and the second ADC 124, where the second copy of the SUT is received via the second probe 125. Each of the first and second probes 115 and 125 may be oscilloscope voltage probes, for example.

In this configuration, the measurement error that is introduced by only the first channel 110' or the second channel 120' also includes additive errors from the first and second probes 115 and 125, and the first and second probe amplifiers 116 and 126, respectively. That is, the measurement error introduced by the first input channel 110 includes additive errors from at least the first probe 115, the first probe amplifier 116, the first amplifier 112 and the first ADC 114, and the measurement error introduced by the second input channel 120 includes additive errors from at least the second probe 125, the second probe amplifier 126, the second amplifier 122 and the second ADC 124. Otherwise, the test system 100' is substantially the same as the test system 100, discussed above.

Figure 2:
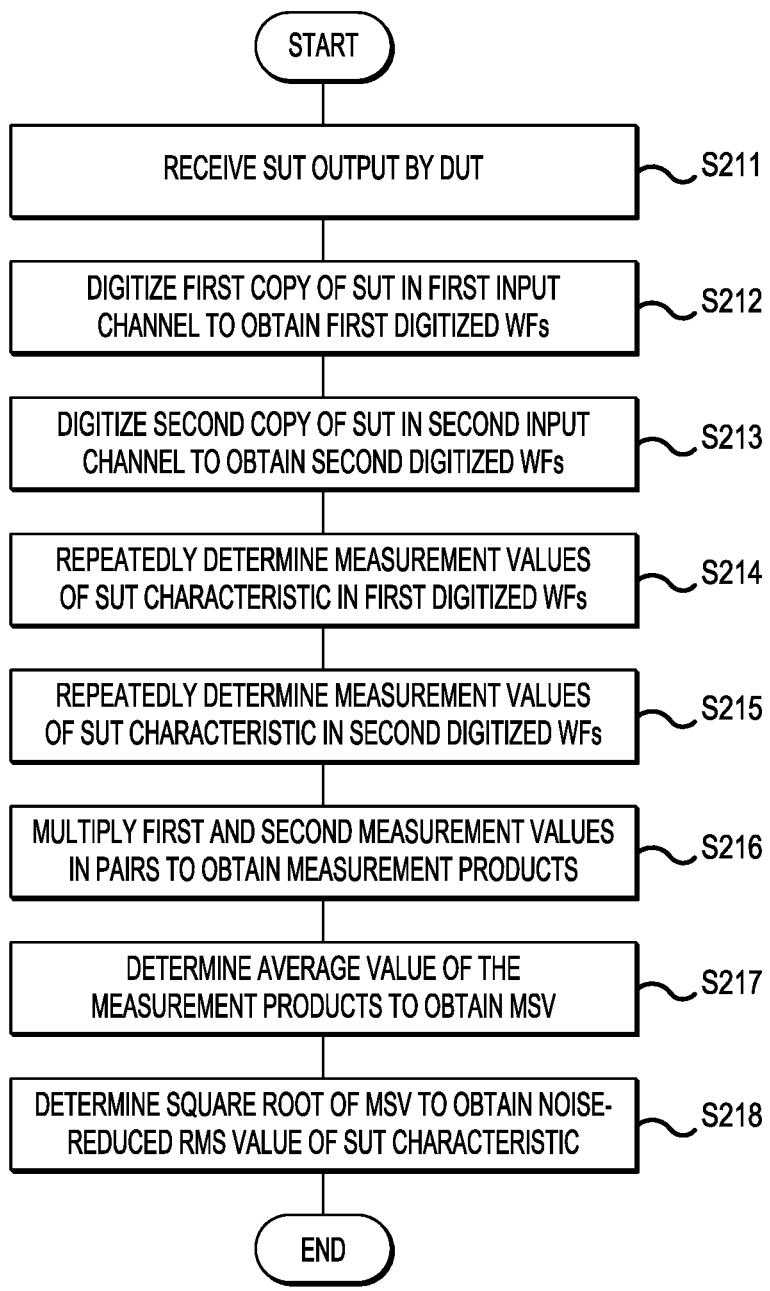
FIG. 2 is a simplified flow diagram showing a method of testing a SUT using a signal measurement device having multiple input channels, according to a representative embodiment.

FIG. 2 is a simplified flow diagram showing a method of testing a SUT using a signal measurement device having multiple input channels, according to a representative embodiment. The testing may include, for example, measuring a characteristic of the SUT output by a DUT while substantially removing the measurement errors introduced by the multiple input channels, respectively. The method shown in FIG. 2 generally relies on matching data from two copies of the SUT to form pairs of measurement values each corresponding to a particular time. The processing of the measurement values is performed on a set of measurement pairs that are unrelated to the time and frequency domains.

Referring to FIG. 2, the method includes receiving the SUT output by the DUT at block S211, where the SUT may be an RF signal. In the depicted embodiment, two copies of the SUT are received via first and second channels of the signal measurement device as a first copy and a second copy, respectively. When the SUT is a single-ended RF signal, the first and second copies of the SUT may be obtained using an RF splitter or a diplexer, for example. When the SUT is a differential signal, the first and second two copies may be inverted and non-inverted portions of the differential signal, respectively.

The first copy is received by a first input channel of one or more test systems (e.g., test system 100, 100'), and the second copy is received by a second input channel of the one or more test systems. For example, the first and second input channels may be part of a single oscilloscope. Or, the first input channel may be part of a first oscilloscope and the second input channel may be part of a second oscilloscope, where the first and second oscilloscopes are synchronized with one another.

The first copy of the SUT is digitized (e.g., by first ADC 114) in the first input channel at block S212 to obtain one or more first digitized waveforms, and the second copy of the SUT is digitized (e.g., by second ADC 124) in the second input channel at block S213 to obtain one or more second digitized waveforms. A time base (e.g., time base 105) may be used to synchronize the timing of the first and second digitized waveforms so that the two copies of the SUT are digitized substantially simultaneously. The digitizing in blocks S212 and S213 is performed on the copies of the SUT without heterodyning.

The first and second digitized waveforms are processed (e.g., by DSP 130). The processing includes repeatedly determining measurement values of the SUT characteristic in the first digitized waveforms in block S214 to obtain first measurement values, and repeatedly determining measurement values of the SUT characteristic in the second digitized waveforms in block S215 to obtain second measurement values. Each of the determined second measurement values is paired with a corresponding one of the determined first measurement values, respectively, to obtain multiple measurement value pairs. The determination of the first and second measurement values in blocks S214 and S215 may be repeated until all the available measurements from that acquisition have been processed, although fewer than all the available measurements may be determined if sufficient measurement error reduction is achieved sooner. Generally, the measurement error approaches zero as the number of first and second measurement values increases. Additional first and second measurement values may be added from subsequent SUT acquisition(s), if desired, although the subsequent SUT acquisition(s) would occur after determination of mean-squared value (MSV) in block S217 or after determination of root-mean-squared (RMS) value in block S218, discussed below. The number of measurement value pairs to include is essentially a trade off between desired accuracy and length of measurement time.

The first and second measurement values may be paired into the measurement value pairs based on corresponding time locations on the SUT. This may be accomplished through the synchronization of the first ADC 114 and the second ADC 124, or by triggering two independent time bases (not shown) using unique waveform features. Thus, the first and second measurement values in each measurement value pair may be measured substantially simultaneously and/or are associated with the same time. That is, the measurement value pair is simultaneous to the extent that the respective first and second measurement values remain associated with one another. In block S216, the first measurement value and the second measurement value in each of the measurement value pairs are multiplied together, thereby obtaining multiple measurement products corresponding to the times associated with the measurement value pair.

In block S217, an average value of the measurement products is determined, thereby obtaining a mean-squared value (MSV) of the measurement of the SUT characteristic. In particular, where A represents the measurement error in the first channel, B represents the measurement error in the second channel, and C represents variation in the SUT affecting the measured characteristic, then the first measurement value may be indicated by A+C and the second measurement value may be indicated by B+C. It follows that the mean of the measurement products of the respective measurement value pairs is $E[(A+C)*(B+C)]$, which may be written as $E[A*B+A*C+B*C+C*C]$. Here, $E[X]$ is used to represent the expected value of X (the average or mean of X). Assuming that A, B and C are uncorrelated from one another, ultimately $E[A*B+A*C+B*C+C*C]=E[A*B]+E[A*C]+E[B*C]+E[C*C]$ and $E[A*B]=E[A*C]=E[B*C]=0$, as the first and second measurement values are repeatedly determined, such that $E[(A+C)*(B+C)]=E[C*C]$ given enough averages. Thus, the average value of the measurement products (where N is the number of measurement products obtained) is $E[C*C]=E[C^2]$, or the MSV of C.

A square root of the MSV is determined in block S218 to obtain a root-mean-squared (RMS) value of the SUT characteristic being measured. The RMS value of the SUT characteristic includes variations in the SUT, which are in both the first and second channels (correlated variations), and substantially omits variations not in the SUT, but which were introduced by only one of the first channel or the second channel (uncorrelated variations). The variations that would otherwise be introduced by the first channel or the second channel correspond to the measurement errors introduced by the first channel or the second channel, respectively. Therefore, block S218 provides a noise-reduced RMS value of the measured SUT characteristic, substantially removing the uncorrelated additive errors of the first and second channels.

In an embodiment, the method may further include amplifying the first copy of the SUT using a first amplifier in the first channel of the signal measurement device prior to digitizing the first copy, and amplifying the second copy of the SUT using a second amplifier in the second channel of the signal measurement device prior to digitizing the second copy of the SUT. When the first and second copies of the SUT are amplified, respectively, the measurement error that is in only one of the first channel or the second channel includes noise introduced by the first and second amplifiers, respectively.

The SUT characteristic that may be measured includes different types of error. For example, the first measurement values may be measures of time error or phase error of the first digitized waveforms, and the second measurement values may be measures of time error or phase error of the second digitized waveforms. In this case, repeatedly determining measurement values of the first digitized waveforms (time error or phase error) in block S214 may include performing edge finding on the first digitized waveforms, and repeatedly determining measurement values of the second digitized waveforms in block S215 may include performing edge finding on the second digitized waveforms, for example. As used herein, edge finding includes locating the times of threshold crossings of a digitized waveform (e.g., each of the first and second digitized waveforms). Time error may be determined by the difference of the located edge times from the ideal or desired times of the edges, or time error may be the variation of time between adjacent edges.

Other examples of SUT characteristics that may be measured according to the method of FIG. 2, while correcting for measurement error introduced by only the first channel or only the second channel, include phase noise, jitter (e.g., time jitter, TIE jitter, random jitter, deterministic jitter, period-to-period jitter, total jitter), frequency, period, pulse width, rise time, voltage noise, and slew rate, as mentioned above.

Figure 3:
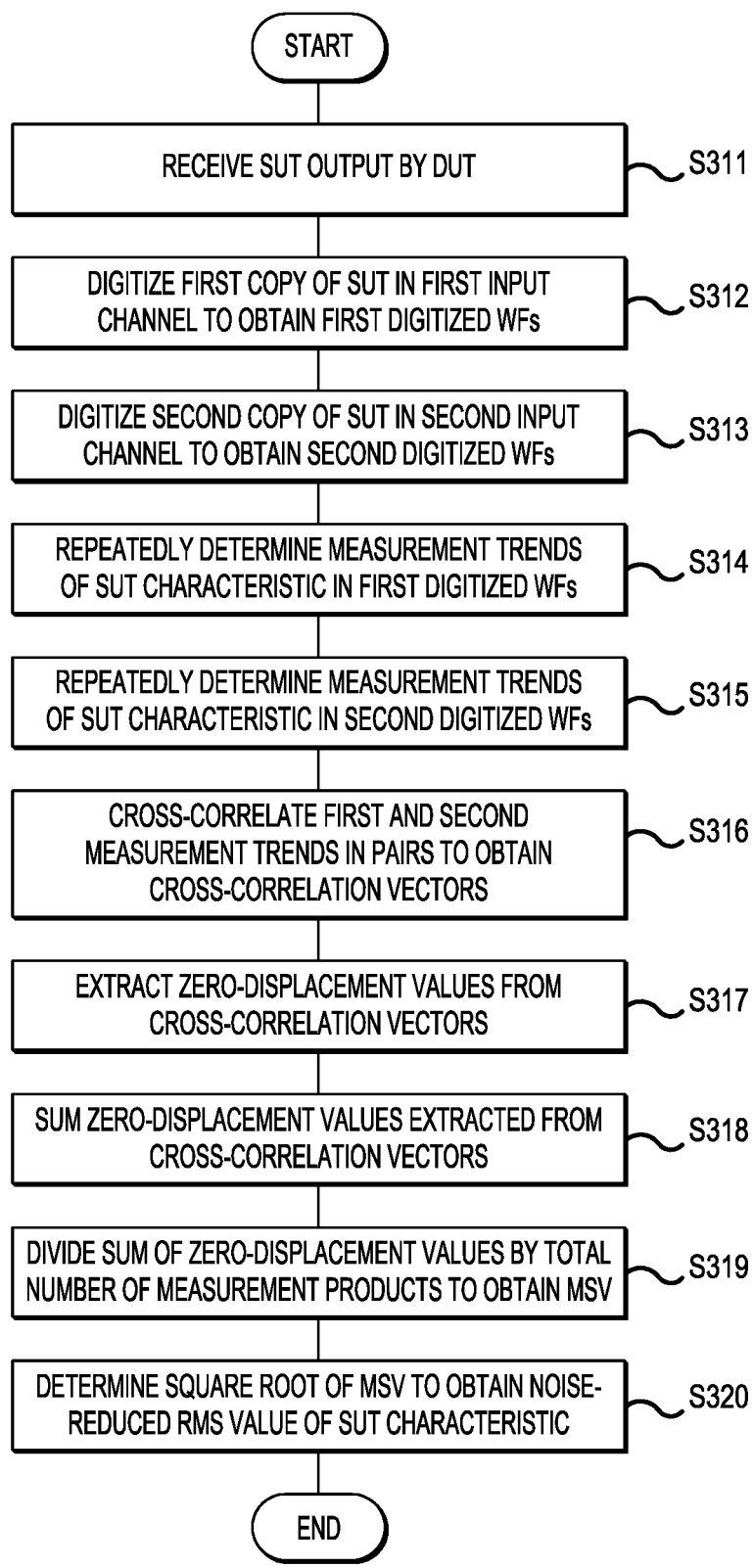
FIG. 3 is a simplified flow diagram showing a method of testing a SUT using a signal measurement device having multiple input channels, according to a representative embodiment.

FIG. 3 is a simplified flow diagram showing a method of testing a SUT using a signal measurement device having multiple input channels, according to a representative embodiment. The testing may include, for example, measuring a characteristic of the SUT output by a DUT while substantially removing the measurement errors introduced by the multiple input channels, respectively. The method shown in FIG. 3 generally relies on matching data trends from two copies of the SUT to form sets of measurement trend vectors.

Referring to FIG. 3, the method includes receiving the SUT output by the DUT at block S311, where the SUT may be an RF signal. In the depicted embodiment, two copies of the SUT are received via first and second channels of the signal measurement device as a first copy and a second copy, respectively. The SUT may be a single-ended RF signal or a differential signal, so that the two copies may be provided as discussed above. The first copy is received by a first input channel of one or more test systems (e.g., test system 100, 100'), and the second copy is received by a second input channel of the one or more test systems. For example, the first and second input channels may be part of a single oscilloscope. Or, the first input channel may be part of a first oscilloscope and the second input channel may be part of a second oscilloscope, where the first and second oscilloscopes are synchronized with one another.

The first copy of the SUT is digitized (e.g., by first ADC 114) in the first input channel at block S312 to obtain one or more first digitized waveforms, and the second copy of the SUT is digitized (e.g., by second ADC 124) in the second input channel at block S313 to obtain one or more second digitized waveforms. Digitizing the first and second copies of the SUT may be performed substantially simultaneously. A time base (e.g., time base 105) may be used to synchronize the timing of the first and second digitized waveforms, and to track timing of the first and second digitized waveforms in order to track data and data trends of the first digitized waveform and corresponding data and data trends of the second digitized waveform. The digitizing in blocks S312 and S313 is performed on the copies of the SUT without heterodyning.

The first and second digitized waveforms are processed (e.g., by DSP 130). The processing includes repeatedly determining a first measurement trend of the one or more first digital waveforms in block S314 to obtain multiple first measurement trends, each first measurement trend corresponding to multiple measurements of the SUT characteristic in the one or more first digitized waveforms, respectively. The process likewise includes repeatedly determining a second measurement trend of the one or more second digital waveforms in block S315 to obtain multiple second measurement trends, each second measurement trend corresponding to multiple measurements of the SUT characteristic in the one or more second digitized waveforms, respectively. Each second measurement trend is paired with a first measurement trend, respectively, to obtain multiple measurement trend pairs. The first and second measurement trends may be paired by alignment in time. Because multiple measurement trends and pairs of measurement trends may be operated on, the paired measurement trends that are aligned in time need to be tracked. The first and second measurement trends in each measurement trend pair may be measured substantially simultaneously and/or are associated with the same timeframe. That is, the measurement trend pair is simultaneous to the extent that the respective first and second measurement trend values remain associated with one another.

The first measurement trend and the second measurement trend in each of the measurement trend pairs are cross-correlated in block S316 to obtain corresponding cross-correlation vectors. Therefore, each cross-correlation vector is determined from a measurement trend pair that corresponds to the same time frame. For each value in a cross-correlation vector (which may be considered an output vector), the first and second measurement trends from the measurement trend pair (which may be considered input vectors) are multiplied together and summed up using different time-skews (displacements) between them.

In block S317, the zero-displacement values are extracted from the cross-correlation vectors, respectively. Extracting the zero-displacement value from a cross-correlation vector includes identifying the one output vector value that was computed using zero skew between the two input vectors, and discarding the other output vector values from the output vector. The zero-displacement values of the cross-correlation vectors are summed in block S318, and the sum of the zero-displacement values is divided by a total number of measurement products of the multiple cross-correlation vectors to obtain an average value of the measurement products, where the average value corresponds to a MSV of the SUT characteristic being measured in block S319.

In an alternative embodiment, the MSV of each cross-correlation vector is first determined. This may be done by summing the measurement products of the first and second measurement trends, and then dividing the sum by the number of points (the size of the input vectors) in the measurement trend pair. The MSVs of the cross-correlation vectors are combined to obtain a total MSV of the SUT characteristic. Notably, though, the measurement trend pairs may include different numbers of points for providing the measurement products. In this case, the number of points summed in each measurement trend pair to calculate the corresponding individual MSV needs to be determined, so that a weighted average may be used when combining the individual MSVs to obtain the total MSV.

A square root of the MSV is determined in block S320 to obtain a RMS value of the SUT characteristic being measured. The RMS value includes variations in the SUT, which are in both the first and second channels, and substantially omits variations not in the SUT, but which were introduced by only one of the first channel or the second channel. The variations that would otherwise be introduced by the first channel or the second channel correspond to the measurement error introduced by the first channel or the second channel, respectively. Therefore, block S320 provides a noise-reduced RMS value of the measured SUT characteristic, substantially removing the additive errors of the first and second channels.

The SUT characteristic that may be measured includes different types of error over a predetermined time period. For example, the first measurement trends may be measures of time error or phase error of the first digitized waveforms over the predetermined time period, and the second measurement trends may be measures of time error or phase error of the second digitized waveforms over the predetermined time period. In this case, repeatedly determining measurement trends of the SUT characteristic in the first digitized waveforms (time error or phase error) in block S314 may include performing edge finding on the first digitized waveforms, and repeatedly determining measurement trends of the second digitized waveforms in block S315 may include performing edge finding on the second digitized waveforms, for example, as discussed above.

Figure 4:
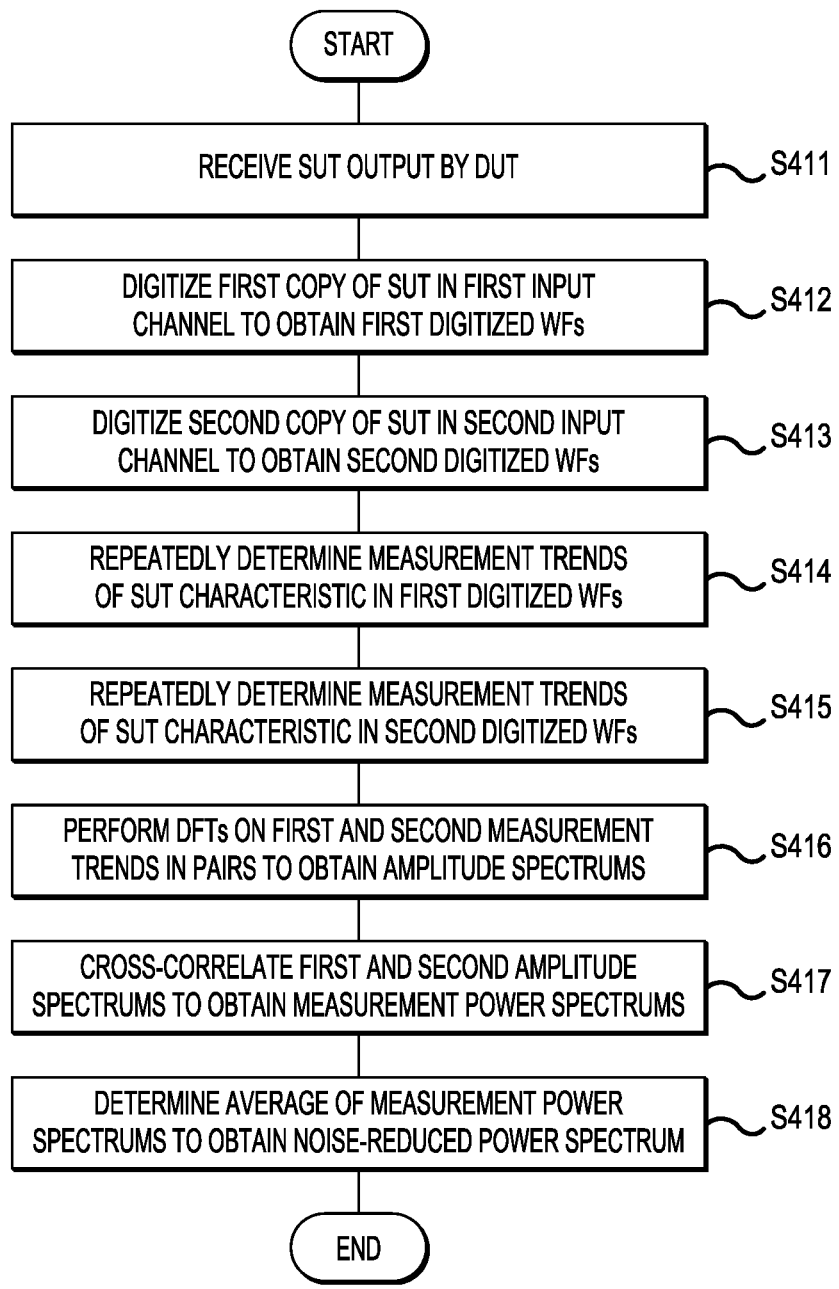
FIG. 4 is a simplified flow diagram showing a method of testing a SUT using a signal measurement device having multiple input channels, according to a representative embodiment.

FIG. 4 is a simplified flow diagram showing a method of testing a SUT using a signal measurement device having multiple input channels, according to a representative embodiment. The testing may include, for example, measuring a characteristic of the SUT output by a DUT while substantially removing the measurement errors introduced by the multiple input channels, respectively. As in FIG. 3, the method shown in FIG. 4 generally relies on matching data trends from two copies of the SUT to form sets of measurement trend vectors. Unlike the method shown in FIG. 3, however, the processing of the measurement trends shown in FIG. 4 is performed in the frequency domain.

Referring to FIG. 4, the method includes receiving the SUT output by the DUT at block S411, where the SUT may be an RF signal. In the depicted embodiment, two copies of the SUT are received via first and second channels of the signal measurement device as a first copy and a second copy, respectively. The SUT may be a single-ended RF signal or a differential signal, so that the two copies may be provided as discussed above. The first copy is received by a first input channel of one or more test systems (e.g., test system 100, 100'), and the second copy is received by a second input channel of the one or more test systems. For example, the first and second input channels may be part of a single oscilloscope. Or, the first input channel may be part of a first oscilloscope and the second input channel may be part of a second oscilloscope, where the first and second oscilloscopes are synchronized with one another.

The first copy of the SUT is digitized (e.g., by first ADC 114) in the first input channel at block S412 to obtain one or more first digitized waveforms, and the second copy of the SUT is digitized (e.g., by second ADC 124) in the second input channel at block S413 to obtain one or more second digitized waveforms. Digitizing the first and second copies of the SUT may be performed substantially simultaneously. A time base (e.g., time base 105) may be used to track timing of the first and second digitized waveforms in order to track data and data trends of the first digitized waveform and corresponding data and data trends of the second digitized waveform. The digitizing in blocks S412 and S413 is performed on the copies of the SUT without heterodyning.

The first and second digitized waveforms are processed (e.g., by DSP 130). The processing includes repeatedly determining a first measurement trend of the one or more first digital waveforms in block S414 to obtain multiple first measurement trends, each first measurement trend corresponding to multiple measurements of the SUT characteristic in the one or more first digitized waveforms, respectively. The process likewise includes repeatedly determining a second measurement trend of the one or more second digital waveforms in block S415 to obtain multiple second measurement trends, each second measurement trend corresponding to multiple measurements of the SUT characteristic in the one or more second digitized waveforms, respectively. Each second measurement trend is paired with a first measurement trend, respectively, to obtain multiple measurement trend pairs. The first and second measurement trends may be paired by alignment in time. Because multiple measurement trends and pairs of measurement trends may be operated on, the paired measurement trends that are aligned in time need to be tracked. The first and second measurement trends in each measurement trend pair may be measured substantially simultaneously and/or are associated with the same timeframe. That is, the measurement trend pair is simultaneous to the extent that the respective first and second measurement trend values remain associated with one another. Determining the first measurement treads of the SUT characteristic in the first digitized waveforms may include performing edge finding on the first digitized waveforms, and determining the second measurement values of the SUT characteristic in the second digitized waveforms may include performing edge finding on the second digitized waveforms, as discussed above.

A discrete Fourier transform (DFT) is performed on the first measurement trend and the second measurement trend in each of the measurement trend pairs in block S416 to obtain corresponding first and second measurement amplitude spectrums for each of the measurement trend pairs. The first and second measurement amplitude spectrums are in the frequency domain. In block S417, the first measurement amplitude spectrum and the second measurement amplitude spectrum in each of the measurement trend pairs are cross-correlated to obtain corresponding multiple measurement power spectrums.

The measurement power spectrums are averaged together in block S418 to obtain an average measurement power spectrum of the SUT. The average measurement power spectrum of the SUT is that found in both the first and second channels, and substantially omits measurement error introduced by only one of the first channel or the second channel. In other words, block S418 provides a noise-reduced measurement power spectrum of the SUT characteristic being measured.

In an embodiment, the method may further include deriving an average amplitude spectrum of the SUT based on the average measurement power spectrum. The average amplitude spectrum may be preferable to the average measurement power spectrum under certain circumstances, e.g., when computing amplitude of spurious errors, or in accordance with user preference. Also, single-sideband phase noise of the SUT may be derived based on the average measurement power spectrum.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed:

1. A method of measuring a characteristic of a signal under test (SUT) output by a device under test (DUT) using a signal measurement device having a plurality of input channels, the method comprising:
   receiving the SUT;
   digitizing a first copy of the SUT in a first input channel of the plurality of input channels to obtain one or more first digitized waveforms without heterodyning;
   digitizing a second copy of the SUT in a second input channel of the plurality of input channels to obtain one or more second digitized waveforms without heterodyning;
   repeatedly determining a first measurement trend to obtain a plurality of first measurement trends, each first measurement trend corresponding to measurements of the SUT characteristic in each first digitized waveform, respectively;
   repeatedly determining a second measurement trend to obtain a plurality of second measurement trends, each second measurement trend corresponding to measurements of the SUT characteristic in each second digitized waveform, respectively, each second measurement trend being paired with a first measurement trend, respectively, to obtain a plurality of measurement trend pairs;
   performing a discrete Fourier transform (DFT) on the first measurement trend and the second measurement trend in each of the measurement trend pairs to obtain corresponding first and second measurement amplitude spectrums for each of the plurality of measurement trend pairs;
   cross-correlating the first measurement amplitude spectrum and the second measurement amplitude spectrum in each of the measurement trend pairs to obtain a plurality measurement power spectrums; and
   averaging the measurement power spectrums to obtain an average measurement power spectrum of the SUT, which is in both the first and second channels, and substantially omitting measurement errors not in the SUT, which are introduced by only one of the first channel or the second channel.

2. The method of claim 1, further comprising deriving an average amplitude spectrum of the SUT based on the average measurement power spectrum.

3. The method of claim 1, further comprising deriving single-sideband phase noise of the SUT based on the average measurement power spectrum.

4. The method of claim 1, wherein repeatedly determining the first measurement trend of the SUT characteristic in the first digitized waveforms comprises performing edge finding on the first digitized waveforms, and
   wherein repeatedly determining the second measurement trend of the SUT characteristic in the second digitized waveforms comprises performing edge finding on the second digitized waveforms.

5. The method of claim 1, wherein the first and second measurement trends are paired by alignment in time.

6. The method of claim 1, wherein the first measurement trend comprises a time error measurement trend in the first digitized waveforms, and
   wherein the second measurement trend comprises a time error measurement trend in the second digitized waveforms.

7. The method of claim 1, wherein the first measurement trends comprise phase error measurement trends in the first digitized waveforms, and
   wherein the second measurement trends comprise phase error measurement trends in the second digitized waveforms.

8. The method of claim 1, wherein the first and second measurement trends comprise sequential time vectors.

9. The method of claim 1, wherein the SUT is a differential signal, and the first and second copies of the SUT, respectively digitized in the first and second channels, correspond to inverted and non-inverted sides of the differential signal.

10. The method of claim 1, wherein the SUT is a single-ended signal, the method further comprising:
    splitting the SUT into the first and second copies of the SUT, respectively digitized in the first and second channels.

11. The method of claim 1, wherein the first copy of the SUT is received via a first probe connected to the first channel, and the second copy of the SUT is received via a second probe connected to the second channel.

12. A system for measuring a characteristic of a signal under test (SUT) output by a device under test (DUT), the system comprising:
    a first analog to digital converter (ADC) configured to receive a first copy of the SUT via a first channel, and to digitize the first copy of the SUT to obtain first digitized waveforms without heterodyning;
    a second ADC configured to receive a second copy of the SUT via a second channel, and to digitize the second copy of the SUT to obtain one or more second digitized waveforms without heterodyning;
    at least one processor; and
    at least one memory storing instructions that, when executed by the at least one processor, cause the at least one processor to:
    repeatedly determine a first measurement trend to obtain a plurality of first measurement trends, each first measurement trend corresponding to measurements of the SUT characteristic in each first digitized waveform, respectively;
    repeatedly determine a second measurement trend to obtain a plurality of second measurement trends, each second measurement trend corresponding to measurements of the SUT characteristic in each second digitized waveform, respectively, each second measurement trend being paired with a first measurement trend, respectively, to obtain a plurality of measurement trend pairs;
    perform a discrete Fourier transform (DFT) on the first measurement trend and the second measurement trend in each of the measurement trend pairs to obtain corresponding first and second measurement amplitude spectrums for each of the plurality of measurement trend pairs;
    cross-correlate the first measurement amplitude spectrum and the second measurement amplitude spectrum in each of the measurement trend pairs to obtain a plurality measurement power spectrums; and
    average the measurement power spectrums to obtain an average measurement power spectrum of the SUT, which is in both the first and second channels, and substantially omit measurement errors not in the SUT, which are introduced by only one of the first channel or the second channel.

13. The system of claim 12, wherein the instructions further cause the at least one processor to:
   derive an average amplitude spectrum of the SUT based on the average measurement power spectrum.

14. The system of claim 12, wherein the instructions further cause the at least one processor to:
   derive single-sideband phase noise of the SUT based on the average measurement power spectrum.

15. The system of claim 12, wherein the instructions cause the at least one processor to repeatedly determine the first measurement trend of the SUT characteristic in the first digitized waveform by performing edge finding on the first digitized waveforms, and to repeatedly determine the second measurement trend of the SUT characteristic in the second digitized waveforms by performing edge finding on the second digitized waveform.

16. The system of claim 12, further comprising:
   a time base configured to synchronize the first and second ADCs.

17. The system of claim 16, wherein the first and second measurement trends are paired by alignment in time.

18. The system of claim 12, wherein the SUT is a differential signal, and the first and second copies of the SUT, respectively digitized in the first and second channels, correspond to inverted and non-inverted sides of the differential signal.

19. The system of claim 12, wherein the SUT is a single-ended signal, the system further comprising:
   a radio frequency (RF) splitter or a diplexer configured to split the SUT into the first and second copies of the SUT.

20. The system of claim 12, wherein the first copy of the SUT is received via a first probe connected to the first channel, and the second copy of the SUT is received via a second probe connected to the second channel.

* * * * *

UNITED STATES PATENT AND TRADEMARK OFFICE
CERTIFICATE OF CORRECTION

| | | |
|---|---|---|
| PATENT NO. | : 11,255,893 B2 | Page 1 of 1 |
| APPLICATION NO. | : 16/109440 | |
| DATED | : February 22, 2022 | |
| INVENTOR(S) | : Draving | |

It is certified that error appears in the above-identified patent and that said Letters Patent is hereby corrected as shown below:

In the Claims

Column 15, Line 38, and Column 16, Line 61, after "plurality", insert --of--.

Signed and Sealed this
Fifth Day of July, 2022

*Katherine Kelly Vidal*

Katherine Kelly Vidal
*Director of the United States Patent and Trademark Office*